United States Patent [19]
Willink

[11] Patent Number: 5,854,756
[45] Date of Patent: Dec. 29, 1998

[54] DIGITAL FILTERS

[75] Inventor: Edward Daniel Willink, Reading, England

[73] Assignee: Racal-Datacom Limited, England

[21] Appl. No.: 689,859

[22] Filed: Aug. 15, 1996

[30] Foreign Application Priority Data

Feb. 1, 1996 [GB] United Kingdom ............... 9602035

[51] Int. Cl.$^6$ ........................................... G06F 17/10
[52] U.S. Cl. ........................................ 364/724.16
[58] Field of Search ............... 364/724.011, 724.012, 364/724.03, 724.1, 724.12, 724.16, 724.2; 333/166

[56] References Cited

U.S. PATENT DOCUMENTS

| | | | |
|---|---|---|---|
| 3,829,798 | 8/1974 | Byram et al. | 333/166 |
| 3,860,892 | 1/1975 | Speiser et al. | 333/166 |
| 3,979,701 | 9/1976 | Tomozawa | 333/70 |
| 4,791,597 | 12/1988 | Miron et al. | 364/724.03 |

FOREIGN PATENT DOCUMENTS 2177564  1/1987  United Kingdom .

OTHER PUBLICATIONS

Chris Gatercole & Peter Ross, "Dynamic Training Subset Selection for Supervised Learning in Genetic Programming", Feb. 25, 1994, pp. 1–10, Department of Artificial Intelligence University of Edinburgh, Edinburgh EH1 1HN U.K.

*Primary Examiner*—Chuong Dinh Ngo
*Attorney, Agent, or Firm*—William A. Newton

[57] ABSTRACT

A FIR digital filter comprises a plurality of cascaded subfilters all operable at the same sampling rate. At least one of the subfilters has a z-transform transfer function defined by a partially factorized, $n^{th}$-order polynomial in $z^{-1}$, where $n>2$ whose co-efficients are quantized. A process for deriving the z-transform transfer function of the filter is described.

11 Claims, 3 Drawing Sheets

DIGITAL FILTERS

BACKGROUND OF THE INVENTION

1. Field of the Invention

This invention relates to digital filters, particularly, though not exclusively finite impulse response (FIR) digital filters.

The invention also relates to a technique for deriving the z-transform transfer function for a FIR digital filter.

In an application of the invention the technique may be used to derive infinite impulse response (IIR) digital filters.

2. Description of Prior Art

In a known implementation of a FIR digital filter, the z-transform transfer function $H(z)$ has the form of a polynomial in $z^{-1}$, given by the expression $$H(z) = \frac{Y(z)}{X(z)} = \sum_{i=0}^{N} h(i)z^{-i}, \quad (1)$$

which can be rewritten as $$Y(z) = \sum_{i=0}^{N} h(i)z^{-i}X(z). \quad (2)$$

By performing an inverse transform on equation (2) the current output sample $y(n)$ (in real time) can be represented in terms of the current and past input samples $x(n) \ldots x(n-N)$ (in real time) by the expression, $$y(n) = \sum_{i=0}^{N} h(i)x(n-i), \quad (3)$$

which can be realized in practice by a simple filter structure, known as a direct form structure, as shown in FIG. 1 of the accompanying drawings. In this structure, each component referenced $z^{-1}$ is a delay equal to the filter sampling period.

In another known implementation of a FIR digital filter, the filter structure is configured as a plurality of cascaded subfilters. In this case, the z-transform transfer function $H(z)$ is expressed as the product $$H(z) = \prod_{n=1}^{N_m} H_n(z),$$

where $H_n(z)$ is the transfer function for each subfilter, which may be either a second order polynomial in $z^{-1}$, of the form $$H_n(z) = \alpha_{0n} + \alpha_{1n}z^{-1} + \alpha_{2n}z^{-2},$$

or a first order polynomial in $z^{-1}$ of the form $$\alpha_{0n} + \alpha_{1n}z^{-1}.$$

This form of FIR digital filter can be realized by the structure shown in FIG. 2, and each individual subfilter may be realized as a direct form structure of the kind shown in FIG. 1.

As well as defining the filter response, the form of the transfer function $H(z)$ will determine the number of hardware components, such as multipliers, adders and delays and/or the amount of processing needed.

SUMMARY OF THE INVENTION

In general, it is desirable to reduce the complexity of the filter structure and, to this end, it has proved beneficial to express each coefficient in the transfer function $H(z)$ in terms of the sum and difference of a few (typically two) powers-of-two coefficients. One advantage of this simplification is that multiplication steps can be replaced by addition steps.

It is generally desirable to simplify the design of a FIR digital filter with a view to reducing the complexity of processing and/or power consumption.

According to a first aspect of the invention there is provided a FIR digital filter comprising a plurality of cascaded subfilters all operable at the same sampling rate, each subfilter having a z-transform transfer function defined by a polynomial in $z^{-1}$, wherein the z-transform transfer function of at least one of the subfilters is defined by a partially factorized, $n^{th}$-order polynomial in $z^{31\ 1}$, where n>2, the order n of a said partially factorized $n^{th}$-order polynomial differs from the order of the polynomial defining the z-transform transfer function of at least one other of the subfilters and the coefficients of the partially factorized $n^{th}$-order polynomial in $z^{-1}$ are all quantized.

Preferably, said coefficients are quantized in terms of the sum of signed powers-of-two. For example, each coefficient may comprise the sum of two signed powers-of-two and has a magnitude not exceeding $2^8$.

The FIR digital filter may include a scale factor stage.

According to a second aspect of the invention there is provided a process for deriving a z-transform transfer function of a FIR digital filter comprising a plurality of cascaded subfilters, the process comprising the steps of:

a) determining a target z-transform transfer function for the filter and evaluating therefrom a first set of z-values for which the transfer function is zero, b) generating a plurality of different $n^{th}$-order polynomials in $z^{-1}$ from different combinations of polynomials in $z^{-1}$ derived from the zero values of said first set, c) quantizing the coefficients of said $n^{th}$-order polynomials to generate a plurality of quantized $n^{th}$-order polynomials in $z^{-1}$, d) factorizing each quantized $n^{th}$-order polynomial to evaluate one or more new values of z for which the polynomial is zero, e) comparing the zero values of said first set with the new zero values derived from the quantized $n^{th}$-order polynomials, f) retaining or rejecting each said quantized, $n^{th}$-order polynomial on the basis of the comparison of zero values, g) using the retained polynomials to generate a plurality of different trial transfer functions having zero values substantially corresponding to the zero values of the target transfer function, h) comparing the trial transfer functions generated at step (g) with the target transfer function, and i) selecting one of the trial transfer functions generated in step (g) as a result of the comparison in step (h).

Said target z-transform function may be derived using a windowed design technique or the Parks-McClellan technique. The process may include adding a scale factor stage to each trial transfer function to normalized gain.

Preferably, the process includes the step of permuting the order of the polynomials from which the selected trial transfer function is generated to minimize implementation costs. Alternatively, this could be achieved by permuting the order of the polynomials from which each trial transfer function is generated.

In a preferred embodiment the coefficients of the $n^{th}$-order polynomials are quantized in terms of the sum of signed two powers-of-two. For example, each coefficient may comprise the sum of two signed powers-of-two and has a magnitude not exceeding $2^8$.

The subfilters may all have transfer functions defined by said retained polynomials. However, one or more (but not all) of the subfilters may have transfer functions defined by polynomials other than retained polynomials, for example a first and/or second order polynomial.

According to a third aspect of the invention there is provided a FIR digital filter having a transfer function derived by the process defined in accordance with said second aspect of the invention.

A FIR digital filter according to the invention is now described, by way of example only, with reference to FIGS. 3 to 5 of the accompanying drawings in which:

DESCRIPTION OF PREFERRED EMBODIMENT

Figure 1:
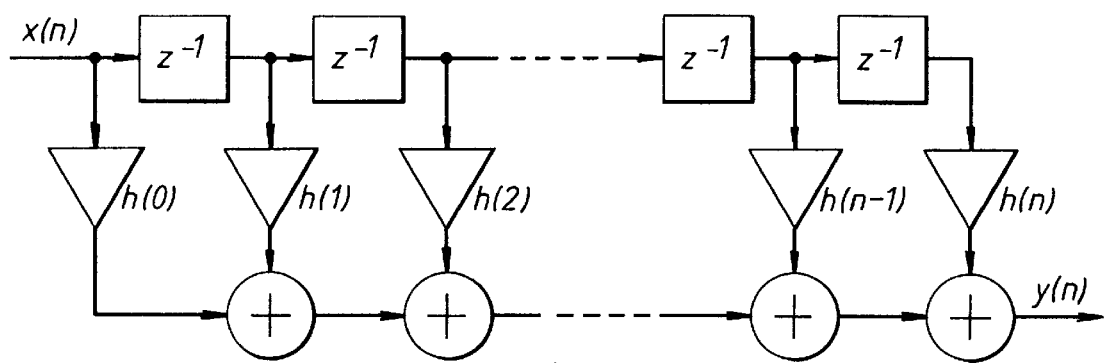
FIG. 1 is a schematic representation of a known FIR digital filter having a direct form structure.
Figure 2:
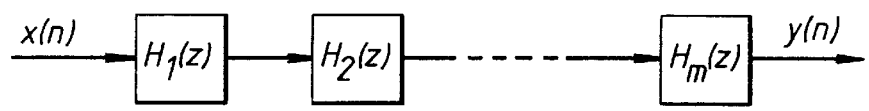
FIG. 2 is a schematic representation of a known FIR digital filter having a cascaded structure.

The FIR digital filter comprises a plurality of cascaded subfilters.

As will be described in greater detail hereinafter, the z-transform transfer function H(z) of the filter is tailored to give a desired filter response, and to achieve this with reduced complexity and greater economy of processing than is possible with many existing design solutions.

The transfer function H(z) is expressed as the product $$H(z) = \prod_{n=1}^{N_m} H_n(z),$$

where $H_n(z)$ is the transfer function for subfilter n in the cascade.

The transfer functions of one or more of the subfilters consist of partially factorized, $n^{th}$-order polynomials in $z^{-1}$, where n>2. The coefficients of the partially factorized polynomials are quantized, preferably in terms of the sum of signed powers-of-two and, in an example, each coefficient is defined by the sum of two signed powers-of-two each of which has a magnitude not exceeding $2^8$.

As will now be demonstrated, the use of quantized, partially factorized polynomials enables a great number of possible design solutions to be considered, and this increase in "design space" enables a less complex, more cost-effective filter structure to be identified. The form of the transfer function and the values of its coefficients are determined by the following design procedure.

Initially, a conventional design technique such as a windowed design technique or a technique employing the Parks-McClellan algorithm is used to generate a target transfer function corresponding to a required filter response.

This transfer function is then factorized in known manner to determine the values of z for which the transfer function is zero. In general, the zero values will be represented by position coordinates in the complex z-plane.

Polynomials in $z^{-1}$, corresponding to the determined zero values are then multiplied together in arbitrary combinations to generate different partially factorized, $n^{th}$-order polynomials, in $z^{-1}$ where n>2. The coefficients of each polynomial generated in this way are then quantized by replacing their actual values by approximated values. In this implementation, the approximated values are defined by the sum of signed powers-of-two.

In the next stage in the procedure, each quantized $n^{th}$-order polynomial is refactorized to determine new values of z for which the polynomial is zero, and these new values are compared with the zero values derived from the originating transfer function. If compared values are within a specified tolerance, the corresponding quantized, $n^{th}$-order polynomial is retained for further processing; if not, the polynomial is rejected.

Subset combinations of the retained polynomials are then used to generate different trial transfer functions for the filter, having zeros at or close to the original values. Each trial transfer function generated will contain at least one polynomial selected from the retained polynomials, and each such selected polynomial defines the transfer function for one of subfilters in the overall cascaded filter structure. The subfilters may all have transfer functions defined by retained polynomials. Alternatively, one or more (but not all) of the subfilters may have transfer functions defined by polynomials other than the retained polynomials, for example first and/or second order polynomials.

The trial transfer functions generated in this manner are then analysed with a view to selecting the optimum transfer function for use as the design solution. To this end, the trial transfer functions are compared with the target transfer function to identify those trial transfer functions whose frequency responses best approximate to the required frequency response, and the cost of implementing each trial transfer function is evaluated.

In general, the selected transfer function will be a compromise, giving the best frequency response attainable at relatively low implementation cost.

The order of the cascaded subfilters will also affect implementation costs. Accordingly, the order of the polynomials defining the subfilters can be permuted, and the optimum order chosen to minimize implementation costs. This choice can be made before or after the best trial transfer function has been selected.

It has been found that with a partially factorized filter design according to the invention, which makes use of one or more quantized, partially factorized $n^{th}$-order polynomials, it is possible to achieve a considerable reduction in the number of processing steps performed by the filter, giving a consequent saving in hardware components, such as adders and delays, and cost.

The described design technique may involve substantial processing; however, the extent of the processing may be substantially reduced by efficient implementation and by imposing one or more constraints on the technique; such constraints may include limiting the order, n, of the polynomials generated, limiting each quantized coefficient to the sum of not more than m (e.g. two) signed powers-of-two and to a preset upper magnitude (e.g. $2^8$), limiting the tolerance between the compared zero-values and by rejecting polynomials which are obviously unsuitable, before they are factorized.

In practice, a balance is struck between retaining too many quantized polynomials which would involve excessive processing to assess all the combinations that result in trial transfer functions, and too few which might not provide sufficient combinations amongst which to find an acceptable design solution.

Figure 3A:
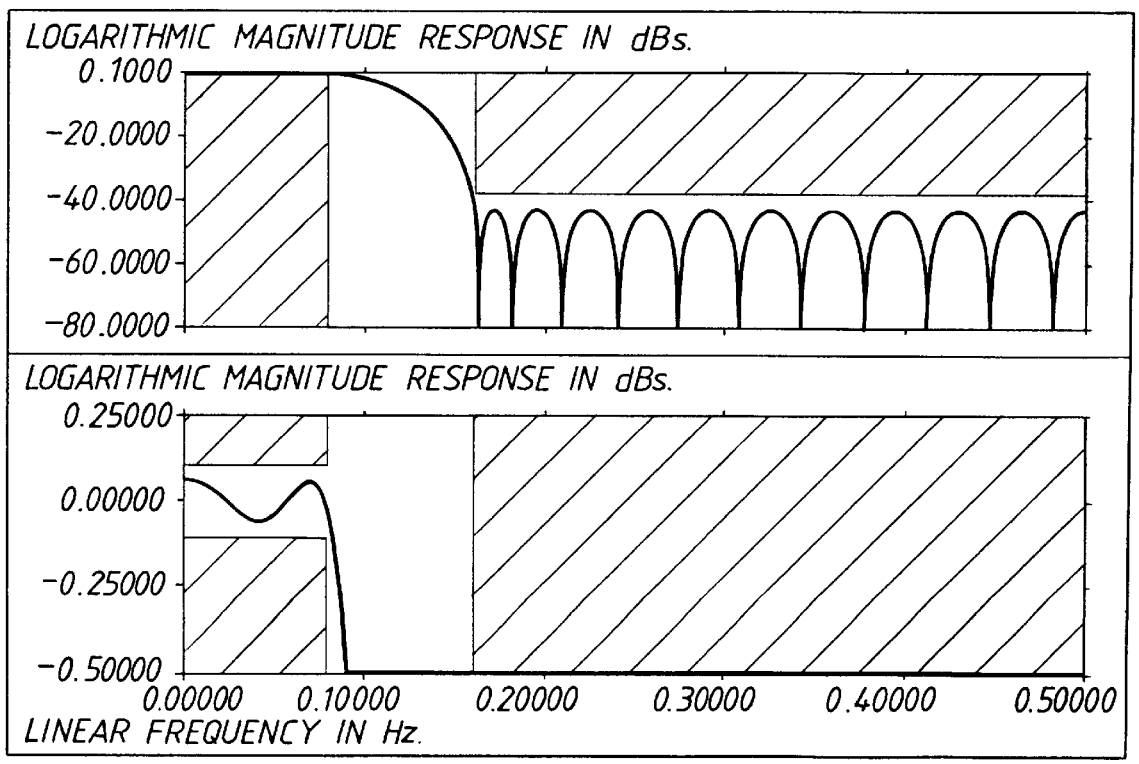
FIG. 3a shows a target frequency response satisfying a required specification mask (shown shaded)

FIG. 3a of the drawings shows a target frequency response of a filter structure having a target transfer function of the form defined by Equation 1 above. The coefficients h(i) of this transfer function are listed in Appendix I, and the zero positions in the complex z-plane are shown in FIG. 3b.

Figure 3B:
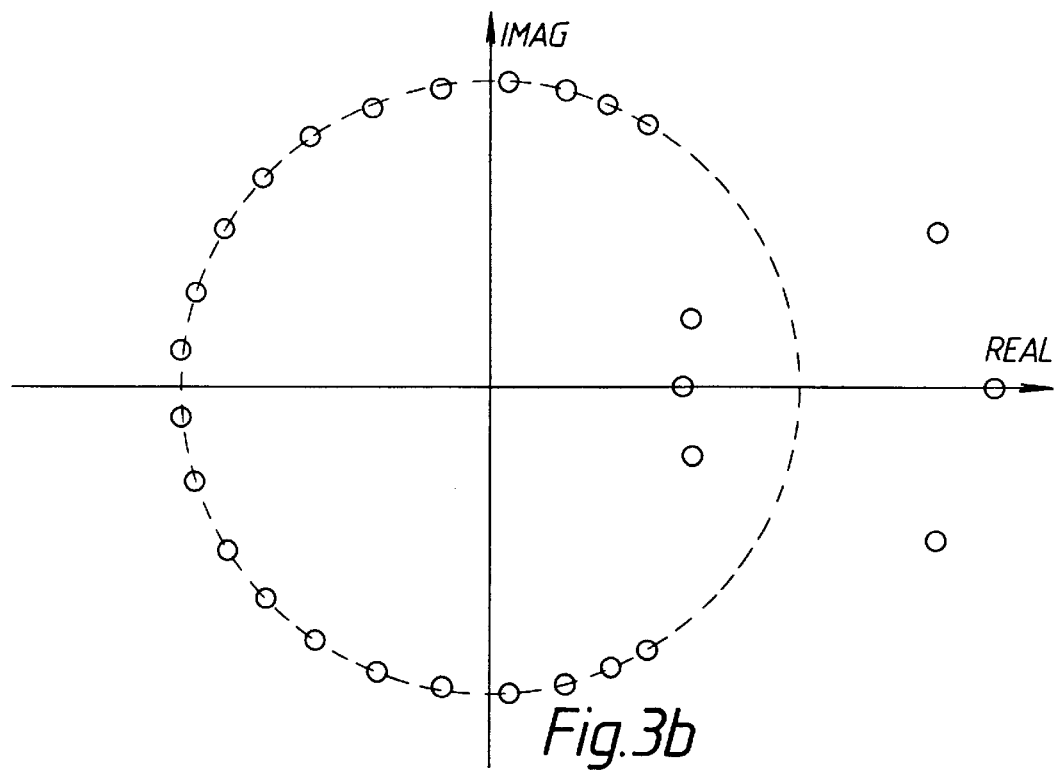
FIG. 3b shows the positions of zeros in a target z-transform transfer function corresponding to the response of the filter structure shown in FIG. 3a, FIG. 4 shows the frequency response of a filter structure according to the invention.
Figure 4:
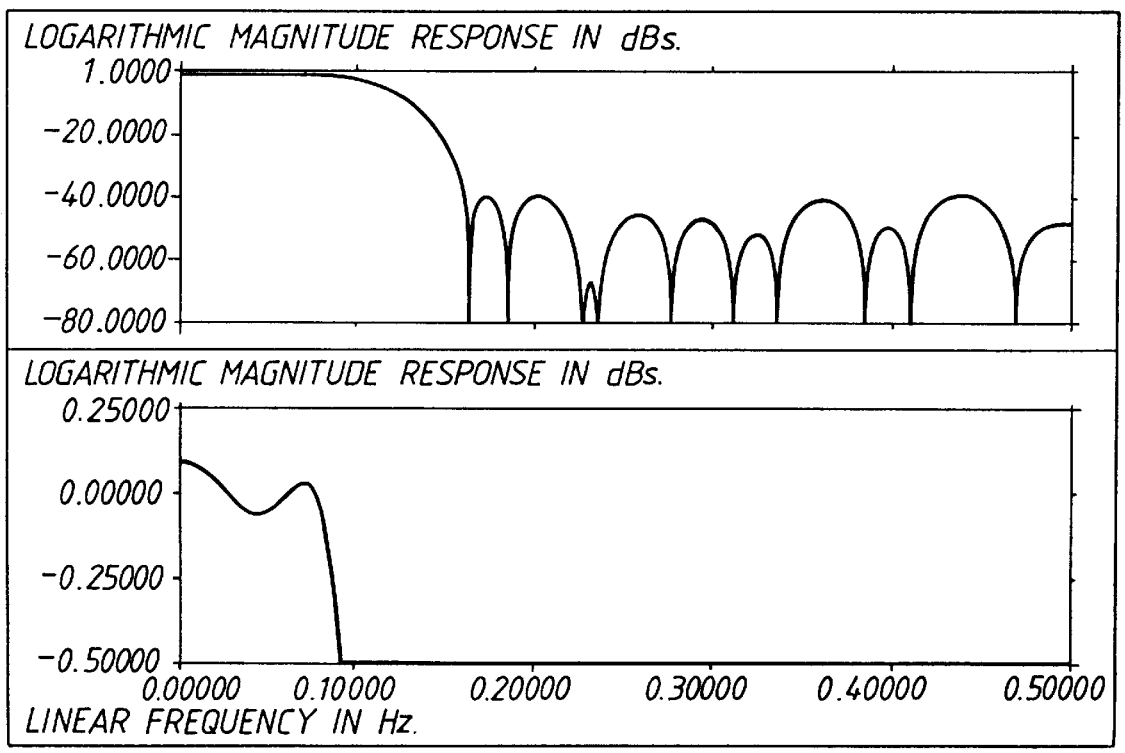

FIG. 4 shows the corresponding frequency response for a filter structure having a partially factorized transfer function derived by the above-described design procedure starting from the zero positions shown in FIG. 3b. In this example, the selected transfer function comprises three cascaded, partially factorized polynomials, as shown in Appendix II, and a fourth scale factor stage given by the sum of two powers-of-two is used to nomalise the overall gain to a power of two.

Figure 5:
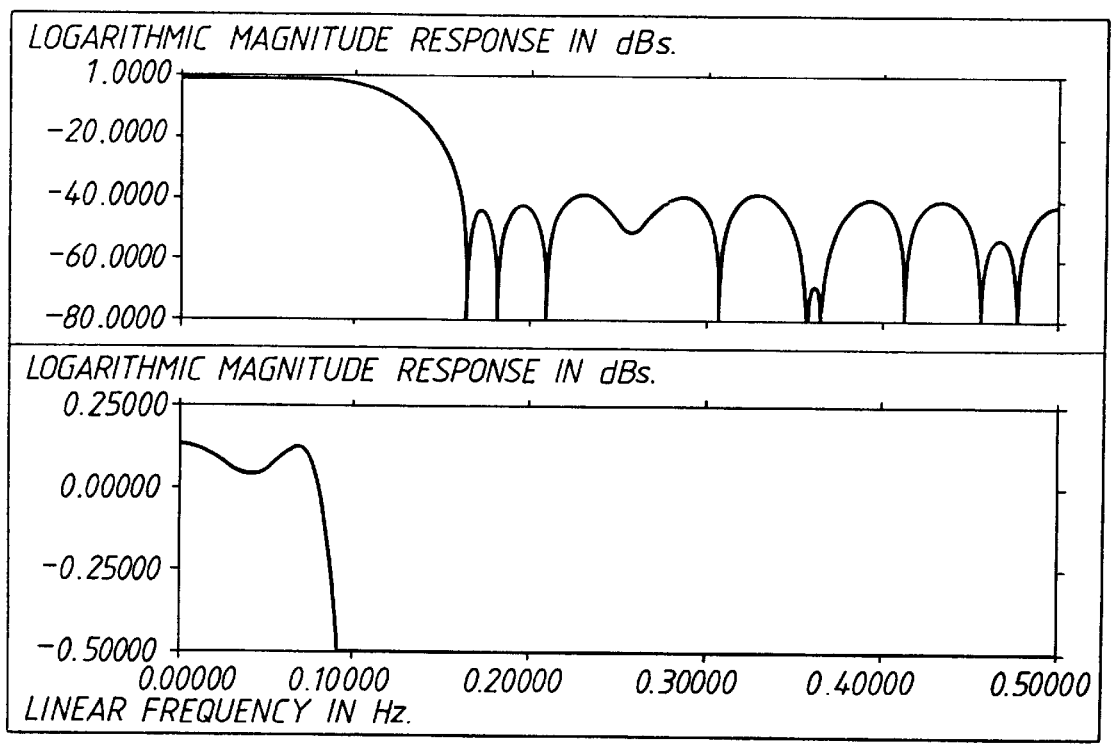
FIG. 5 shows the frequency response of a quantized direct form filter structure.

By way of comparison, FIG. 5 shows the frequency response of a quantized, direct form filter structure based on the structure described by reference to FIGS. 3a and 3b, having coefficients h(i) expressed in terms of the sum of not more than two signed powers-of-two as listed in Appendix III.

Analysis of the frequency responses of FIGS. 4 and 5 shows that the quantized, partially factorized design solution of the present invention (FIG. 4) is 7%. closer to the required target response (FIG. 3a), than is the quantized direct form response (FIG. 5).

Further advantages of the illustrated quantized, partially factorized solution as compared with the quantized direct form solution are that the former requires 18% fewer adders giving a consequent cost saving, and has a smaller coefficient range requiring less precision.

Furthermore, as already explained, a transfer function based on quantized, partially factorized, $n^{th}$-order polynomials enables a very large number of trial design solutions to be considered. This increased design space facilitates the identification of a filter structure which is less complex and requires fewer hardware components and/or processing stages than has hitherto been possible using conventional design techniques based on direct form structures or fully factorized cascaded structures.

In an extension of the invention, transfer functions derived in accordance with the invention may be used to define the numerator and/or the denominator of an Infinite Impulse Response (IIR) direct filter.

| Appendix I |
|---|
| −0.005063592181 |
| −0.001857321329 |
| 0.003037431390 |
| 0.010133191667 |
| 0.014417151701 |
| 0.010047123812 |
| −0.005162246586 |
| −0.026025282640 |
| −0.039905300971 |
| −0.031732480204 |
| 0.007796198834 |
| 0.075172732602 |
| 0.152688982627 |
| 0.214583042656 |
| 0.238208925243 |
| 0.214583042656 |
| 0.152688982627 |
| 0.075172732602 |
| 0.007796198834 |
| −0.031732480204 |
| −0.039905300971 |
| −0.026025282640 |
| −0.005162246586 |
| 0.010047123812 |
| 0.014417151701 |
| 0.010133191667 |

| -continued |
|---|
| Appendix I |
| 0.003037431390 |
| −0.001857321329 |
| −0.005063592181 |

| Appendix II |
|---|
| [8 8 −1 8 8] |
| [4 −1 0 −4 −2 2 8 16 16 16 8 2 −2 −4 0 −1 4] |
| [16 1 −4 −32 −32 −32 −4 1 16] | and a sum of two signed powers of two to adjust the gain to a power of two

| Appendix III |
|---|
| 5 |
| 2 |
| −3 |
| −10 |
| −15 |
| −10 |
| 6 |
| 28 |
| 40 |
| 32 |
| −7 |
| −80 |
| −160 |
| −224 |
| −248 |
| −224 |
| −160 |
| −80 |
| −7 |
| 32 |
| 40 |
| 28 |
| 6 |
| −10 |
| −15 |
| −10 |
| −3 |
| 2 |
| 5 | no scale factor required to adjust gain to a power of two.

The invention claimed is:

1. A process for deriving a z-transform transfer function of a FIR digital filter comprising a plurality of cascaded subfilters, the process comprising the steps of:

a) determining a target z-transform transfer function for the filter and evaluating therefrom a first set of z-values for which the transfer function is zero, b) generating a plurality of different $n^{th}$-order polynomials in $z^{-1}$ from different combinations of polynomials in $z^{-1}$ derived from the zero values of said first set, c) quantizing the coefficients of said $n^{th}$-order polynomials to generate a plurality of quantized $n^{th}$-order polynomials in $z^{-1}$, d) factorizing each quantized nth order polynomial to evaluate one or more new values of z for which the polynomial is zero, e) comparing the zero values of said first set with the new zero values derived from the quantized $n^{th}$ order polynomials, f) retaining or rejecting each quantized, $n^{th}$-order polynomial on the basis of the comparison of zero values, g) using the retained polynomials to generate a plurality of different trial transfer functions having zero values substantially corresponding to the zero values of the target transfer function, h) comparing the trial transfer functions generated at step (g) with the target transfer function, and i) selecting one of the trial transfer functions generated in step (g) as a result of the comparison in step (h).

2. A process as claimed in claim 1 wherein said target z-transform function is derived using a windowed design technique or the Parks-McClellan technique.

3. A process as claimed in claim 1 or claim 2 including adding a scale factor stage to each trial transfer function to normalize gain.

4. A process as claimed in claim 1 comprising the further step of:

permuting the order of the stages with which the selected trial transfer function is realised.

5. A process as claimed in claim 1 comprising the further step of:

permuting the order of the stages with which each trial transfer function is realised.

6. A process as claimed in claim 1, wherein said coefficients are quantized in terms of the sum of signed powers-of-two.

7. A process as claimed in claim 6 wherein each said coefficient comprises the sum of two signed powers-of-two and has a magnitude not exceeding $2^8$.

8. A process as claimed in claim 1 wherein the subfilters all have transfer functions defined by said retained polynomials.

9. A process as claimed in claim 1 wherein one or more (but not all)of the subfilters have transfer functions defined by polynomials other than said retained polynomials.

10. A process as claimed in claim 9 wherein said other polynomials are first and/or second order polynomials.

11. A FIR digital filter having a transfer function derived by a process as claimed in claim 1.

* * * * *